United States Patent [19]

Yoshinaka et al.

[11] Patent Number: 5,091,765
[45] Date of Patent: Feb. 25, 1992

[54] PHOTOCONDUCTIVE CELL WITH ZINC OXIDE TETRAPOD CRYSTALS

[75] Inventors: Minoru Yoshinaka, Higashiosaka; Eizou Asakura, Suita; Mitsumasa Oku, Osaka; Motoi Kitano, Kawanishi; Hideyuki Yoshida, Amagasaki, all of Japan

[73] Assignee: Matsushita Electric Industrial Co., Ltd., Osaka, Japan

[21] Appl. No.: 680,800

[22] Filed: Apr. 3, 1991

Related U.S. Application Data

[63] Continuation of Ser. No. 439,047, filed as PCT/JP89/00216, Mar. 2, 1989, abandoned.

[30] Foreign Application Priority Data

Mar. 4, 1988 [JP] Japan .................... 53-51891

[51] Int. Cl.$^5$ .................... H01L 29/22; H01L 31/08
[52] U.S. Cl. .................... 357/30; 357/10; 423/622; 156/DIG. 77; 156/DIG. 112
[58] Field of Search .................... 357/10, 30; 423/622; 156/DIG. 77, DIG. 112

[56] References Cited

U.S. PATENT DOCUMENTS

| | | | |
|---|---|---|---|
| 3,420,763 | 1/1969 | Polito et al. | 357/10 |
| 3,503,029 | 4/1968 | Matsuoka | 357/10 |
| 3,674,476 | 7/1972 | Tamai et al. | 423/622 |
| 3,867,145 | 2/1975 | Honjo et al. | 423/622 |

FOREIGN PATENT DOCUMENTS

| | | | |
|---|---|---|---|
| 43-25126 | 10/1968 | Japan | 357/10 |
| 48-34492 | 5/1973 | Japan | 357/10 |
| 1504629 | 5/1975 | United Kingdom . | |

OTHER PUBLICATIONS

Patent Abstracts of Japan, vol. 5, No. 200 (C-84)[872] (1981).
Patent Abstracts of Japan, vol. 4, No. 103 (P-20)[585] (1980).
Patent Abstracts of Japan, vol. 6, No. 96 (P-120)[974] (1982).

*Primary Examiner*—Jerome Jackson, Jr.
*Attorney, Agent, or Firm*—Wenderoth, Lind & Ponack

[57] ABSTRACT

A photoconductive cell comprises a photodetector section which consists of an aggregate of tetrapod-like zinc oxide whiskers. Each whisker consists of a core and needle-shaped crystals extending in four different directions from the core. Since this novel tetrapod-like zinc oxide whisker consists of single crystal zinc oxide, it suffers less deterioration. In addition, since the single crystals are transparent and an aggregate thereof has a high porosity, light tends to enter deep portions of the cell so that it exhibits high sensitivity.

2 Claims, 2 Drawing Sheets

PHOTOCONDUCTIVE CELL WITH ZINC OXIDE TETRAPOD CRYSTALS

This application is a continuation of now abandoned application Ser. No. 07/439,047 filed as PCT/JP89/00216, Mar. 2, 1989.

TECHNICAL FIELD

The present invention relates to a photoconductive cell. More particularly, the present invention relates to a novel photoconductive cell with high sensitivity which comprises tetrapod-like zinc oxide whiskers. The photoconductive cell of the present invention finds various applications, for example, photo relays, UV light detecting elements, speed control of small motors, adjustment of sound volume, measurement of blood pulse wave and the like.

BACKGROUND ART

Hitherto, photoconductive cells most widely use CdS in the form of a sintered body, although CdS can be used in the form of single crystal and also in the form of a deposited thin film. In addition to CdS, ZnS, CdSe, GaAs, Si, Ge, PdS, InSb, Se, CdTe, PdSe, PdTe, $Sb_2S_3$, PbO and ZnO are used. To improve the photoconductivity, Ag, Cu, Cl, Ga or Sb is added to the materials.

When light is irradiated for a long time, the conventional photoconductive cell is deteriorated so that its resistance changes. Then, the conventional photoconductive cell has poor reliability.

In addition, it is widely desired to provide a photoconductive cell with higher photosensitivity.

DISCLOSURE OF THE INVENTION

In the present invention, tetrapod-like zinc oxide whiskers each consisting of a core and four needle-shaped crystals which extend from the core in four different directions aggregate to form a photodetector section. Examples of the zinc oxide whiskers are shown in FIGS. 1 and 2.

When the diameter of the root portion of the needle-shaped crystal is from 0.7 to 14 $\mu$m, and the length from the root to tip end of the needle-shaped crystal is from 3 to 200$\mu$, excellent effects are achieved.

Since the photoconductive cell of the present invention comprises an aggregate of the needle-shaped zinc oxide single crystals which is confirmed by X-ray diffraction, it is extremely sensitive and suffers less deterioration.

Since the tetrapod-like zinc oxide whiskers aggregate, the aggregate has high porosity. Further, the zinc oxide whiskers are transparent single crystals. Therefore, light tends to enter deep portions of the cell and is less scattered, so that the cell has high sensitivity.

PREFERRED EMBODIMENTS OF THE INVENTION

The present invention will be illustrated by following Examples.

EXAMPLE 1

Metal zinc powder was ground in a mortar type grinder in the presence of water and kept standing in water for 3 days. After drying, powder was charged in a crucible made of alumina and heated in a furnace kept at 1000° C. for one hour to obtain tetrapod-like zinc oxide whiskers. The needle-shaped crystals had an average diameter of 8 $\mu$m at the root portions and an average length from the root to the tip end of 50 $\mu$m. Most of the whiskers were in the tetrapod-like form in which four needle-shaped crystals extended in four different directions, while some whiskers extended in one-, two- and three-directions.

Figure 1:
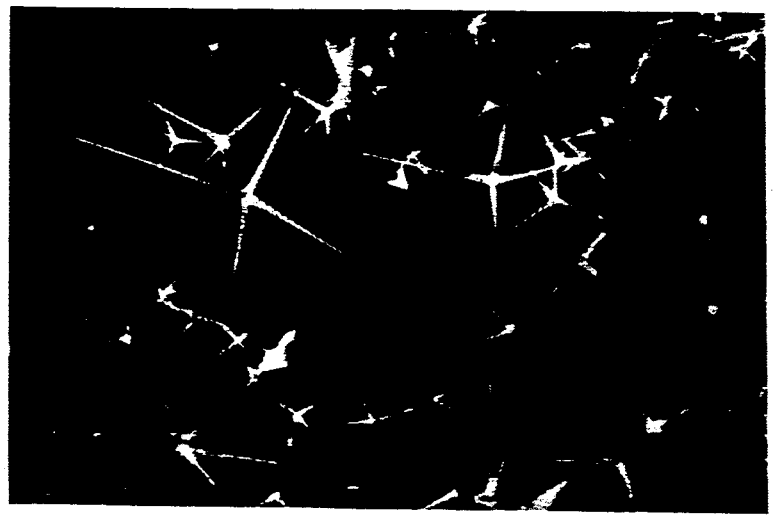
FIGS. 1 and 2 are electron microscopic photographs showing the crystalline structures of the zinc oxide whiskers to be used in the photoconductive cell of the present invention.
Figure 2:
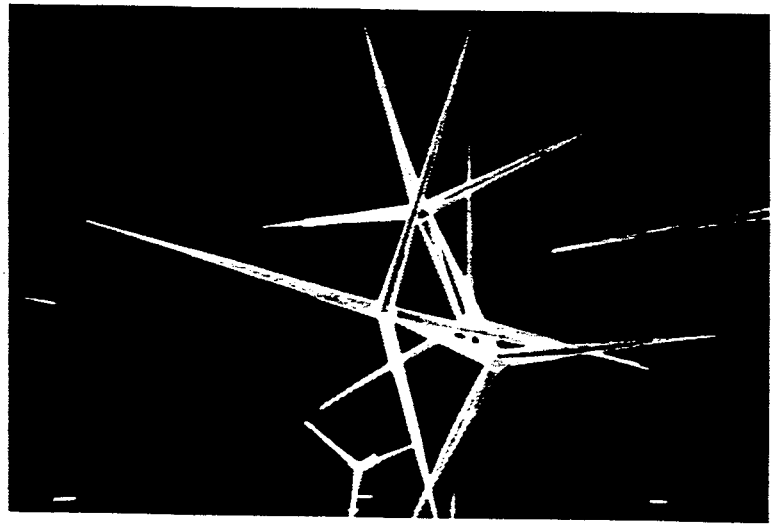
Figure 3:
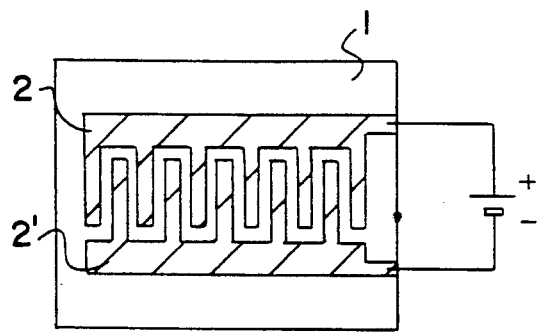
FIG. 3 is a plan view of one embodiment of the photoconductive cell of the present invention.
Figure 4:
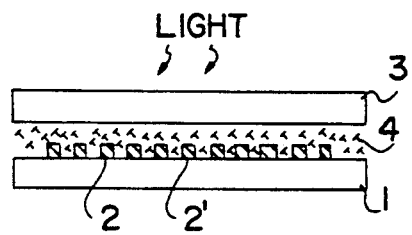
FIG. 4 is a cross section of the photoconductive cell of FIG. 3.

A small amount of the whiskers were sandwiched between a glass plate 1 and a quartz glass plate 3 and pressed under pressure of 500 g/cm$^2$ to a thickness of about 200 $\mu$m (see FIGS. 3 and 4). In these figures, the numerals 2 and 2' stand for a pair of tandem type electrodes formed on the glass plate 1 from aluminum, and 4 stands for the tetrapod-like zinc oxide whiskers. Then, a pressure of 150 g/cm$^2$ was applied to form the photodetector section. To the produced photoconductive cell, light of 300 lux was irradiated while the applied voltage was so controlled that the applied energy was always kept at 300 mW. Under such conditions, the photoconductive cell was continuously kept for 1000 hours. During such period, the change of bright resistance of the cell at one lux was monitored at arbitrary intervals. The results are shown in FIG. 5.

Figure 5:
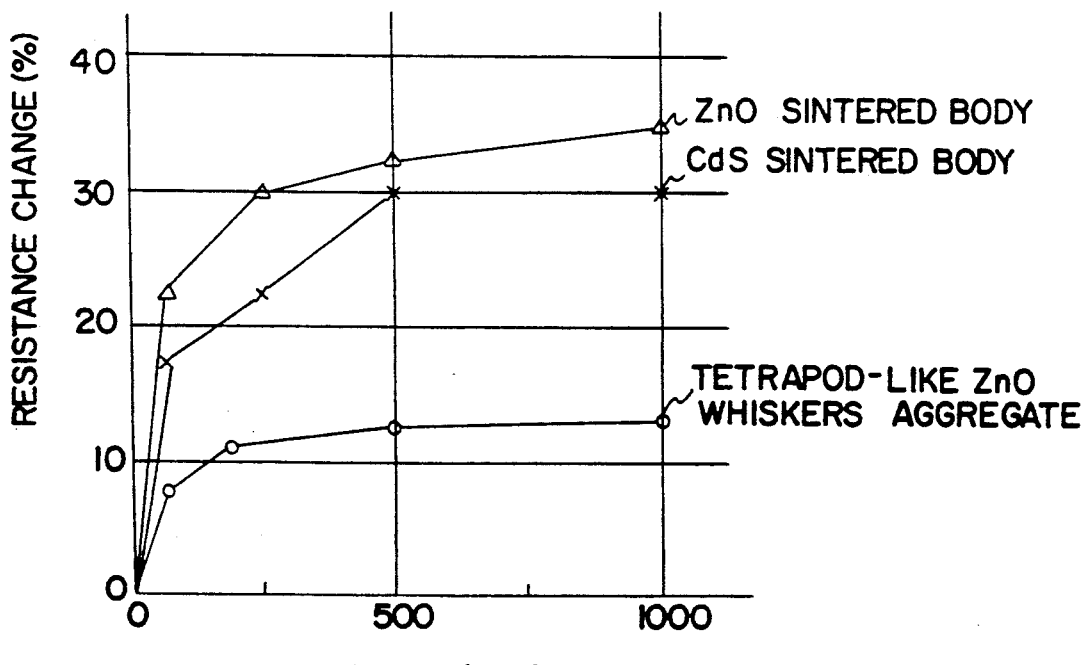
FIG. 5 shows rates of resistance change of several photoconductive cells.

For comparison, the change of bright resistance of the photoconductive cells comprising the CdS and ZnO sintered bodies were monitored and the results are also shown in FIG. 5.

The photoconductive cell of the present invention was very sensitive so that its resistance changed by larger than three orders for the change of illuminance from 0.01 to 1000 lux.

EXAMPLE 2

The same tetrapod-like zinc oxide whiskers as used in Example 1 were mixed with 0.1 atomic % of Cu and sintered at 900° C. Then, on the sintered body, In was vacuum deposited to form electrodes. The produced cell was subjected to a load lifetime test to find that the cell had good characteristics as that of Example 1, and the resistance change was 12% after 1000 hours. The cell was very sensitive so that its resistance changed by larger than three orders for the change of illuminance from 0.01 to 1000 lux.

EXAMPLE 3

In the same manner as in Example 1 but using the minute tetrapod-like whiskers having an average root part diameter of less than 0.7 $\mu$m and average length from the root to the tip end of less than 3 $\mu$m, the cell was produced and its properties were evaluated. The sensitivity of the cell suddenly decreased from the above dimensions, and the resistance change decreased to the level of two orders.

COMPARATIVE EXAMPLE 2

In the same manner as in Example 1 but using a general reagent zinc oxide granules (manufactured by Kanto Chemicals) having a particle size of about 1 μm, a cell was produced, but the cell had no photosensitivity so that no comparison with the cell of the present invention could be made.

While in the above Examples, the tetrapod-like whiskers have comparatively uniform size, the tetrapod-like whiskers having size distribution will give a photoconductive cell having the same properties.

The electrode material may be tin, zinc, gold, silver, copper, iron, nickel, chromium, cobalt, lithium, beryllium, sodium, magnesium, titanium, vanadium, manganese, gallium, antimony, indium, cadmium, palladium, rhodium, ruthenium, technetium, molybdenum, niobium, zirconium, yttrium, strontium, rubidium, scandium, potassium, calcium, astatin, polonium, bismuth, lead, thallium, mercury, platinum, iridium, osmium, rhenium, tungsten, tantalum, hafnium, barium, cesium, francium, radium, lanthanum and lanthanoids, actinium and actinoids as well as their alloys and mixtures.

To modify the properties of the tetrapod-like zinc oxide, at least one of silver, copper, chlorine, gallium, antimony and the above electrode materials can be added in a slight amount. The added amount of such additive is 0 to 10 atomic %, particularly 0.05 to 0.5 atomic % per single element. Excessive addition will increase the dark current and decrease the lifetime of the cell.

Further, other photoconductive materials may be used together with the tetrapod-like zinc oxide whiskers to improve some properties of the cell.

The resistance of the tetrapod-like zinc oxide whiskers can be changed by the addition or doping of aluminum or lithium.

The electrodes may be any form such as a sandwich type, a planer type, a tandem type and a laminate type comprising a transparent conductive film of tin oxide, indium oxide, gold and the like.

As the photodetecting surface, from a very small area to a very large area can be used, and the photoconductive cell of the present invention may be of any shape and have three-dimensional irregularity.

When the length from the root to the tip end of the needle-shaped crystal is from 3 to 200 μm, the whiskers exhibit highly sensitive and stable photoconductivity. But, such length is not limited to the above range. Preferably, the length is from 50 to 150 μm in view of characteristics, stability of the whiskers, handling ease and cost.

When the diameter of the root of the needle-shaped crystal is from 0.7 to 14 μm, the whiskers exhibit highly sensitive and stable photoconductivity. But, such diameter is not limited to the above range. Preferably, the diameter is from 2 to 10 μm in view of characteristics, stability of the whiskers, handling ease and cost.

The thickness of the photodetector section is designed according to the sensitivity, bias voltage, and end use of the cell. In addition, the thickness of the photodetector section depends on the molding press pressure, and the molding press pressure is adjusted in a range in which the tetrapod-like whiskers are not completely destroyed.

Since the photoconductive cell of the present invention comprises an aggregate of the tetrapod-like zinc oxide whisker single crystals, it is highly sensitive and reliable.

What is claimed is:

1. A photoconductive cell comprising a photodetector section which comprises an aggregate containing tetrapod-like zinc oxide whiskers each consisting of a core and four needle-shaped crystals extending in four different directions from the core and each having a diameter of from 0.7 to 14 μm at a root portion of the crystal and a length from the root to a tip end of the crystal of from 3 to 200 μm.

2. The photoconductor cell according to claim 1, wherein the diameter of the root portion of the needle-shaped crystal is from 2 to 10 μm, and the length from the root to the top end of the needle-shaped crystal is from 50 to 150 μm.

* * * * *